United States Patent
Riley (10) Patent No.: US 7,385,538 B2
(45) Date of Patent: Jun. 10, 2008

(54) DELTA SIGMA MODULATOR WITH MULTIPLE FILTERS

(75) Inventor: Tom Riley, Osgoode (CA)

(73) Assignee: Kaben Wireless Silicon Inc., Ottawa (CA)

( * ) Notice: Subject to any disclaimer, the term of this patent is extended or adjusted under 35 U.S.C. 154(b) by 0 days.

(21) Appl. No.: 11/529,250

(22) Filed: Sep. 29, 2006

(65) Prior Publication Data
US 2007/0018872 A1   Jan. 25, 2007

Related U.S. Application Data

(63) Continuation-in-part of application No. PCT/CA2004/000510, filed on Apr. 2, 2004.

(51) Int. Cl.
*H03M 3/00* (2006.01)
(52) U.S. Cl. .................................. 341/143; 375/247
(58) Field of Classification Search ............... 341/143, 341/155; 375/247
See application file for complete search history.

(56) References Cited

U.S. PATENT DOCUMENTS 5,982,317 A * 11/1999 Steensgaard-Madsen .... 341/143
6,249,238 B1   6/2001 Steinlechner
6,515,606 B2 *  2/2003 Lyden ........................ 341/143
6,570,518 B2 *  5/2003 Riley et al. ................. 341/143
6,697,003 B1 *  2/2004 Chen .......................... 341/143
6,744,392 B2 *  6/2004 Melanson ................... 341/143
6,920,182 B2 *  7/2005 Bolton, Jr. .................. 375/247

FOREIGN PATENT DOCUMENTS

EP   0 643 488   3/1995

* cited by examiner

*Primary Examiner*—Jean B Jeanglaude
(74) *Attorney, Agent, or Firm*—Brion Patent Agency; Art Brion (57) ABSTRACT

Methods and devices for an improved delta sigma modulator. The delta sigma modulator has multiple filters with at least one high order filter processing the MSBs of the quantizer fractional output and at least one lower order filter processing the LSBs of the quantizer fractional output. The outputs of these filters are then combined with the input through a combiner with the result being received by the quantizer. The quantizer then produces the output integer bitstream along with the fractional bitstream.

26 Claims, 10 Drawing Sheets

DELTA SIGMA MODULATOR WITH MULTIPLE FILTERS

CROSS REFERENCE TO RELATED APPLICATIONS

This application is a continuation-in-part of international application Number PCT/CA2004/000510 filed 2 Apr. 2004.

FIELD OF THE INVENTION

The present invention relates to digital electronics and, more specifically, relates to devices and methods for a multiple filter delta sigma modulator.

BACKGROUND TO THE INVENTION

The digital revolution of the past few years has given rise to a number of devices which have made mixed signal processing easier if not simply possible. One of these devices is the delta sigma modulator or DSM. A DSM is usually used as the heart of a delta sigma converter—a device that makes it easy to combine high performance analog with digital processing by quickly converting digital signals to analog signal or vice versa. Delta sigma converters deliver high levels of precision when performing this conversion.

The DSM that is at the heart of delta sigma converters produces a bitstream representing the input signal level. In a generic feedback DSM, the bitstream output is generally merely the MSBs (most significant bits) from the quantizer as the LSBs (least significant bits) are fed back, through a suitable filter, to be subtracted from the input signal. Unfortunately, for high order noise shaping uses, the feedback filter could become quite large especially for a high number of LSBs being fed back as an error correction signal. Such a condition leads to more expensive delta sigma converters as more hardware is needed to implement such complex filters.

What is therefore required is a simpler delta sigma modulator which requires less hardware to implement but which also provides a good approximation of the performance of the more complex modulators. It is therefore an object of the present invention to mitigate if not overcome the shortcomings of the prior art.

SUMMARY OF THE INVENTION

The present invention provides methods and devices for an improved delta sigma modulator. The delta sigma modulator has multiple filters with at least one high order filter processing the MSBs of the quantizer fractional output and at least one lower order filter processing the LSBs of the quantizer fractional output. The outputs of these filters are then combined with the input through a combiner with the result being received by the quantizer. The quantizer then produces the output integer bitstream along with the fractional bitstream.

In a first aspect, the present invention provides a delta sigma modulator comprising:
  a combiner receiving an input;
  a quantizer receiving an output of said combiner and producing an integer output and a first and a second fractional output;
  a first filter receiving said first fractional output;
  a second filter receiving said second fractional output, wherein
  said integer output comprises most significant bits of an integer result of said bus splitter;
  said first fractional output comprises most significant bits of a fractional result of said quantizer;
  said second fractional output comprises least significant bits of said fractional result of said quantizer;
  said combiner receives outputs of both first and second filters;
  said first filter is an n order filter, said second filter is an m order filter and n>m.

In a second aspect, the present invention provides a delta sigma modulator comprising:
  a combiner receiving an input;
  a quantizer receiving an output of said combiner and producing an integer output and at least two fractional outputs;
  at least two filters, each of said at least two filters receiving one of said at least two fractional outputs, wherein
  said combiner receives outputs of said at least two filters;
  each of said at least two filters has an order higher than an immediately preceding filter.

In a third aspect the present invention provides a configurable filter comprising:
  a first delay block receiving a bitstream input;
  a second delay block receiving an output of said first delay block;
  a third delay block receiving an output of said second delay block;
  a fourth delay block receiving an output of said third delay block;
  a fifth delay block receiving an output of said fourth delay block;
  a first adder subtracting said output of said fourth delay block from said output of said first delay block;
  a second adder subtracting said output of said second delay block from said output of said third delay block;
  a first gain block receiving an output of said first adder;
  a second gain block receiving an output of said second adder;
  a third adder outputs of said first and second gain block;
  a fourth adder adding an output of said third adder and said output of said fifth gain block;
  a fifth adder adding said output of said first delay block and said output of said third delay block;
  a third gain block receiving an output of said fifth adder;
  a fourth gain block receiving said output of said second gain block;
  a sixth adder adding said output of said fourth delay block and an output of said fourth gain block;
  a seventh adder subtracting an output of said sixth adder from an output of said third gain block;
  a switch block receiving a select input, an output of said fourth adder, and an output of said seventh adder, wherein
  said select input determines if said filter acts as a fourth order filter or a fifth order filter.

BRIEF DESCRIPTION OF THE DRAWINGS

A better understanding of the invention will be obtained by considering the detailed description below, with reference to the following drawings in which.

DETAILED DESCRIPTION

Figure 1:
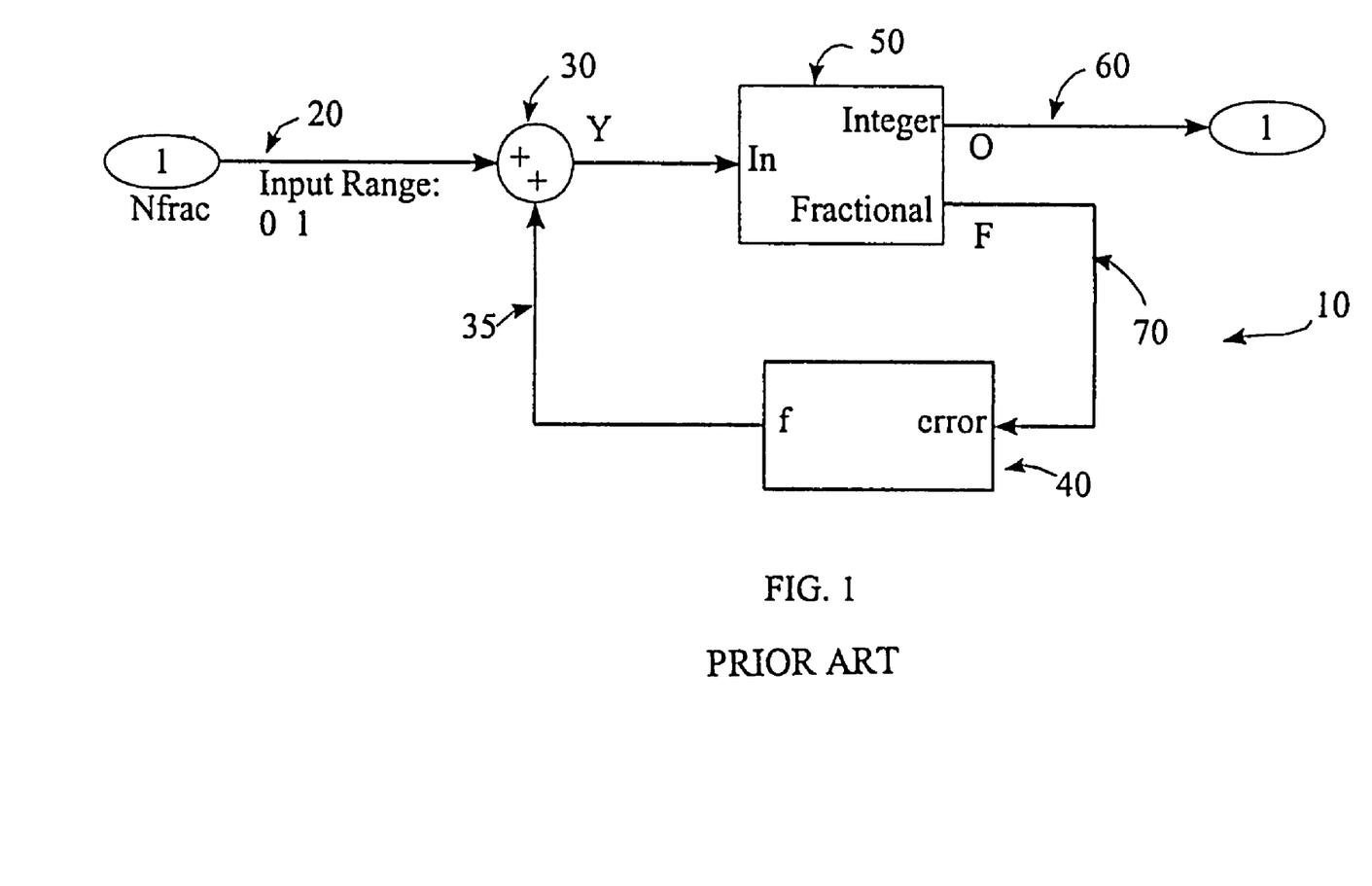
FIG. 1 illustrates a generic error feedback delta sigma modulator according to the prior art.

Referring to FIG. 1, a block diagram of a delta sigma modulator according to the prior art is illustrated. The generic error feedback delta sigma modulator 10 has an input signal 20 that is added by way of an adder 30 to the output 35 of a filter block 40. The output of the adder 30 is received by the quantizer 50. The quantizer 50 produces the bitstream integer output 60 and the bitstream fractional output 70 is received by the filter block 40 and, after processing, is output as the output 35 by the filter block 40.

As noted above, the DSM 10 in FIG. 1 is problematic in that for higher order noise shaping, the filter block 40 can become quite large and unwieldy especially for a large bitwidth.

Figure 2:
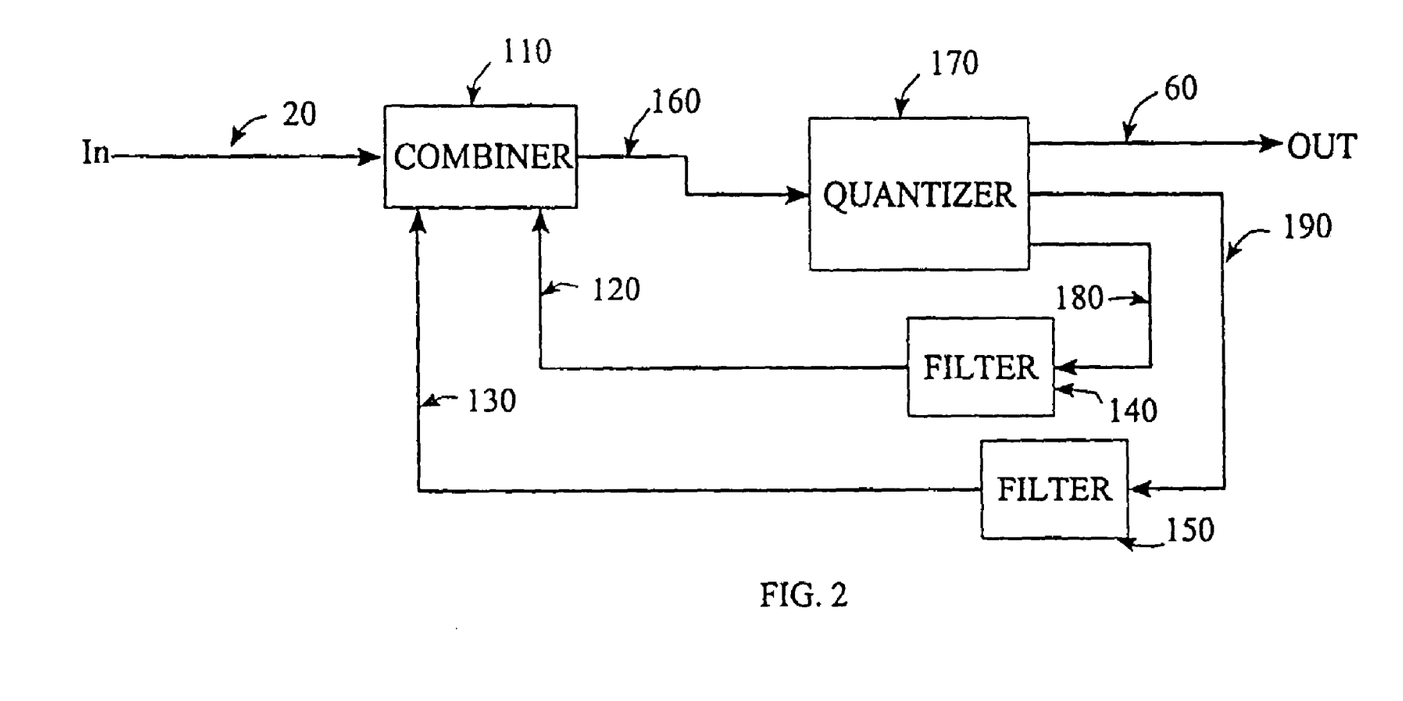
FIG. 2 is a block diagram of a delta sigma modulator according to one aspect of the invention.

Referring to FIG. 2, an improved DSM 100 is illustrated. The DSM 100 also has an input 20 which is fed into a combiner 110. The combiner also receives the outputs 120, 130 of filters 140, 150. The output 160 of the combiner 110 is received by the quantizer 170. The quantizer 170 produces the integer output bitstream 60 while also producing the fractional output MSB bitstream 180 and the fractional output LSB bitstream 190. The integer output bitstream 60 is the output of the modulator 100 and consists of the integer component of the quantized version of the output 160 of the combiner 110.

The fractional output of the quantizer 170 is split into the two bitstreams 180, 190. The MSB (most significant bit) of the fractional portion of the quantized combiner output 160 is output as the output MSB bitstream 180 and is sent to the filter 140. The LSB (less significant bits) of the fractional portion of the quantizer combiner output 160 is output as the output LSB bitstream 190.

The filters 140, 150 are similar to filter 40 in FIG. 1 except that filters 140, 150 are of differing orders. The filter 140 that receives the output MSB bitstream 180 must be a higher order filter than the filter 150 that receives the output LSB bitstream. Thus, if filter 140 is an n order filter and if filter 150 is an m order filter, then n>m. The higher order filter receives the MSB of the fractional output of the quantizer so that the portion of the fractional output that has a more significant impact on the input (by way of combiner 110), receives a higher order filtering.

Figure 3:
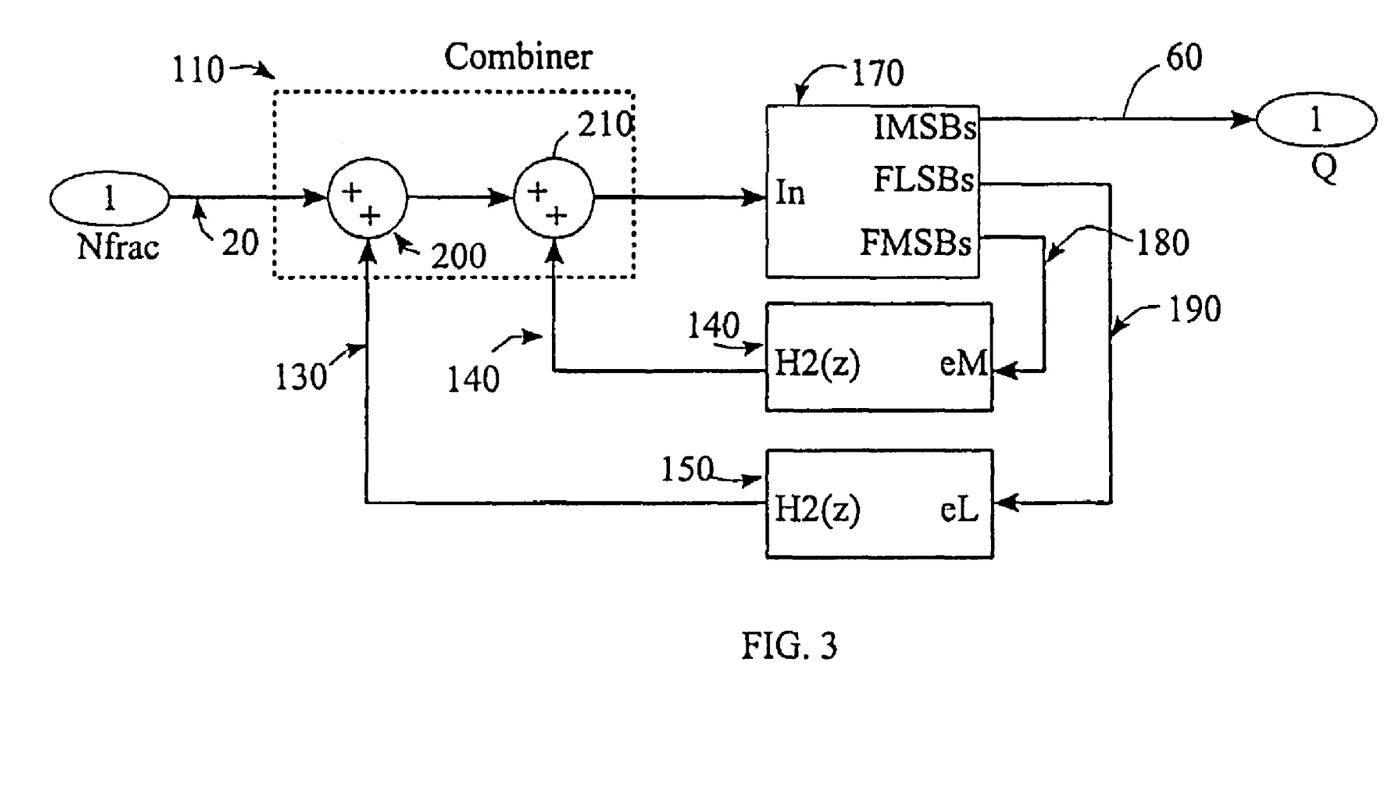
FIG. 3 is a block diagram of a delta sigma modulator as in FIG. 2 showing the details of the combiner.

The combiner 110 can be constructed as two cascaded adders 200, 210. The adder 200 receives the input 20 and adds this to the output 130 of the lower order filter 150. The output of the adder 200 is then received and added by the adder 210 to the output 140 of the higher order filter 140. The output of the adder 210 is then the output 160 of the combiner 110.

Figure 4:
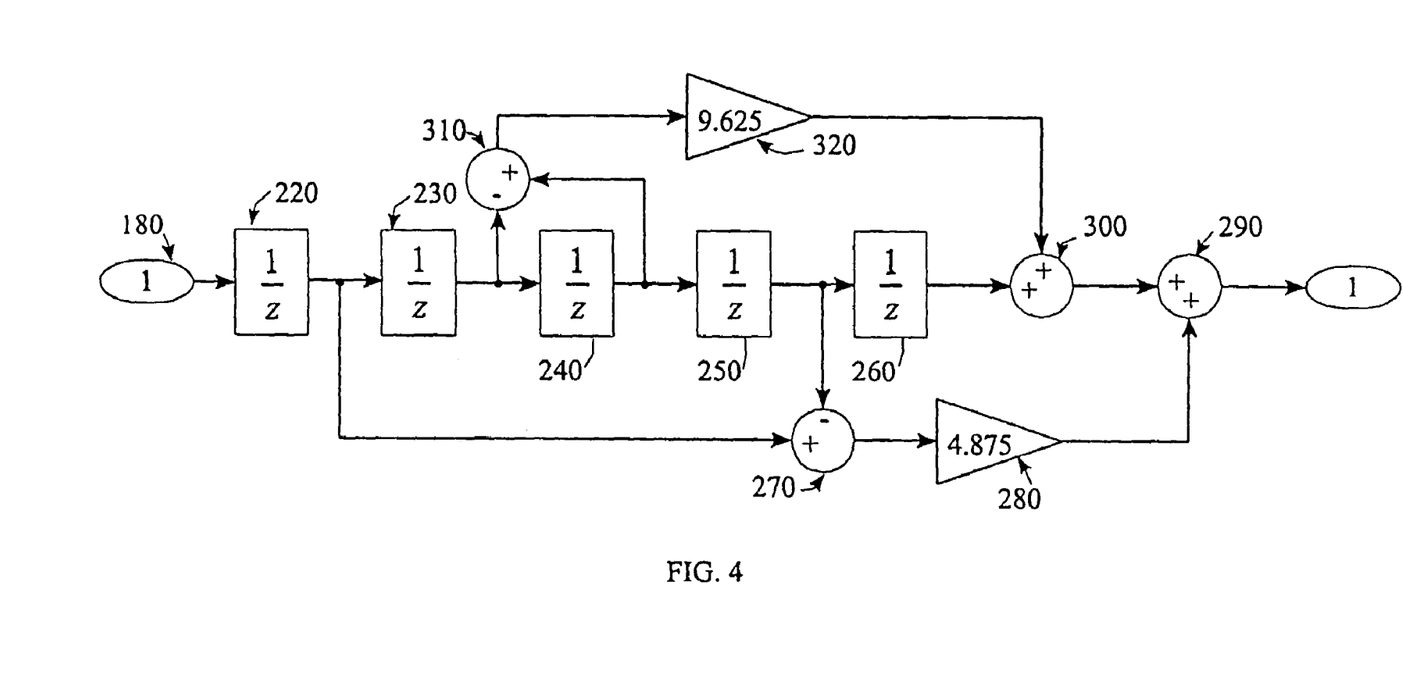
FIG. 4 is a block diagram of a $5^{th}$ order filter which may be used with the delta sigma modulator of FIG. 2.
Figure 5:
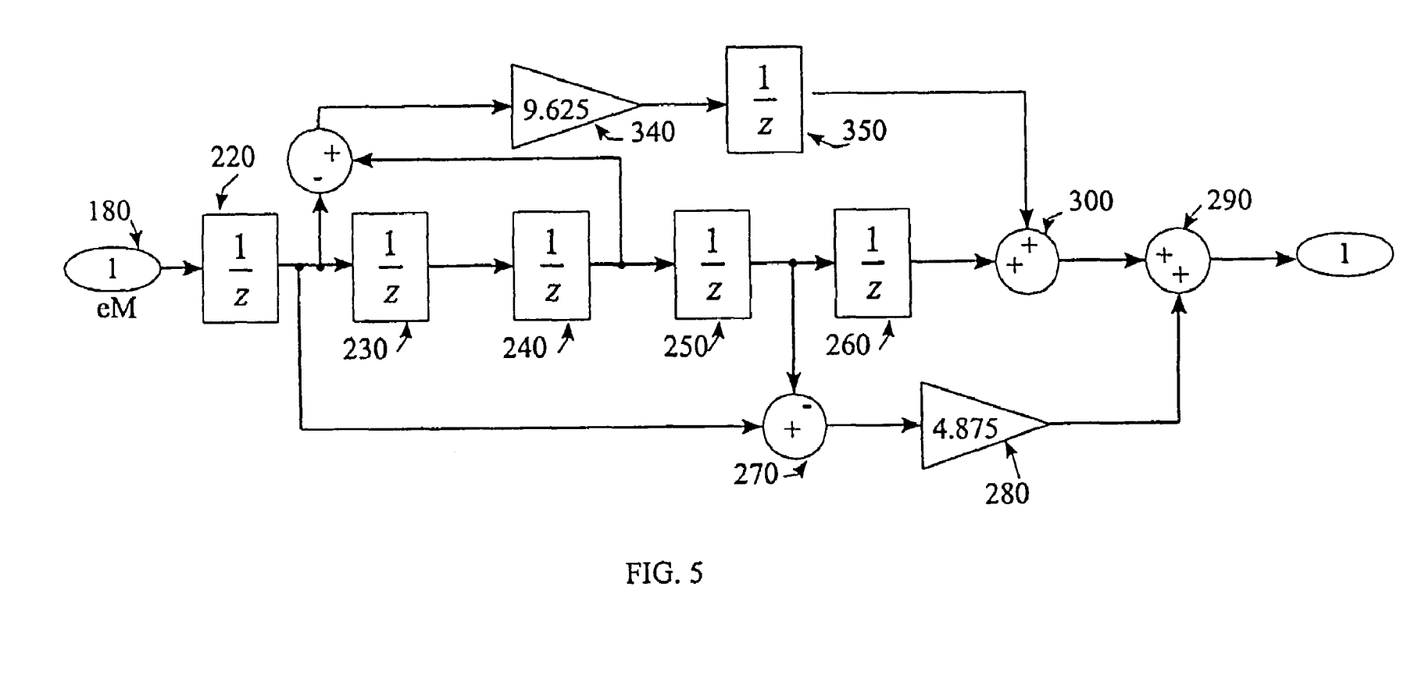
FIG. 5 is a block diagram of another $5^{th}$ order filter which may be used with the delta sigma modulator of FIG. 2.
Figure 6:
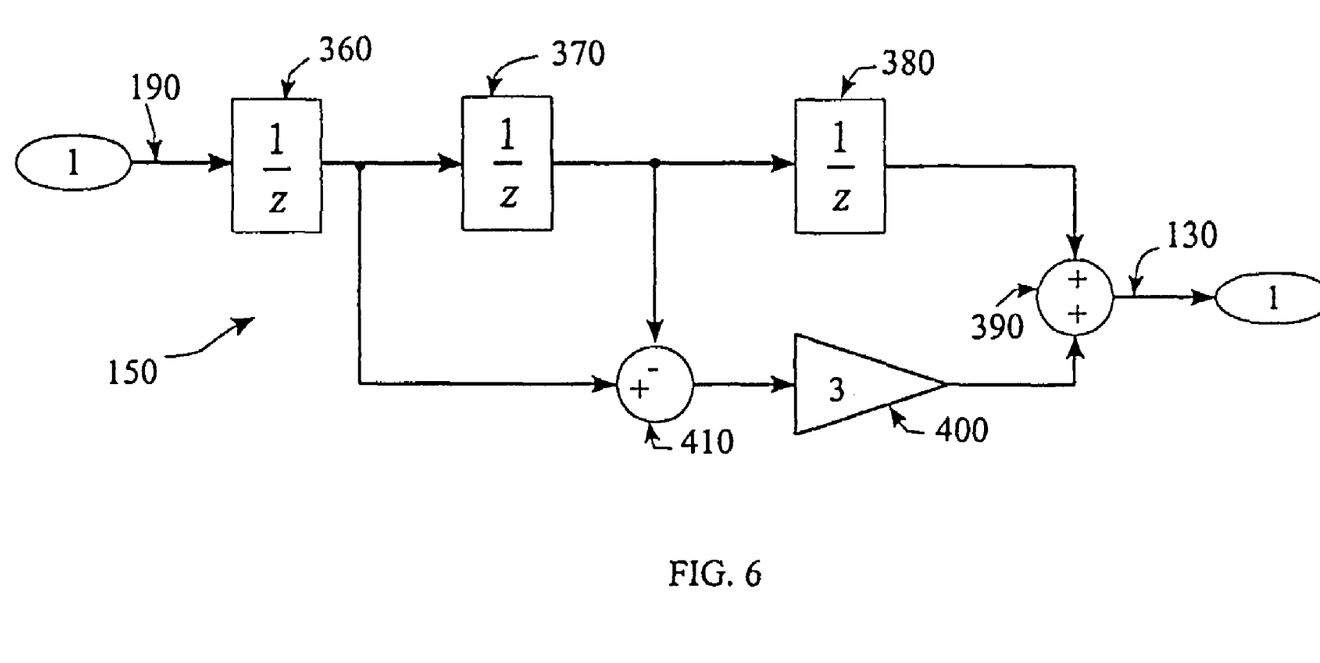
FIG. 6 is a block diagram of a 3rd order filter which may be used with the delta sigma modulator of FIG. 2.

In preferred embodiment, the filter 140 is a $5^{th}$ order filter while the filter 150 is a $3^{rd}$ order filter. Suitably designed $5^{th}$ order filters may be used as the filter 140 and suitably designed $3^{rd}$ order filters may be used as the filter 150. However, it has been found that the $5^{th}$ order filters illustrated in FIGS. 4 and 5 provided efficiencies not found with other $5^{th}$ order filters. Similarly, the $3^{rd}$ order filter illustrated in FIG. 6 provided desirable efficiencies.

Referring to FIGS. 4 and 5, the $5^{th}$ order filters illustrated therein have a common base design. In both designs, the input 180 is received by a first delay block 220, the output of which is received by a second delay block 230. The output of second delay block 230 is then received by the third delay block 240. The output of third delay block 240 is received by the fourth delay block 250 and the output of this fourth delay block 250 is received by fifth delay block 260. Also in both designs, the output of the first delay block 220 is tapped off and received by the adder 270. The adder 270 then subtracts the output of the fourth delay block 250 from this tapped off output of the first delay block. The result of adder 270 is then received by the gain block 280. The output of gain block 280 is then added by adder 290 to the result of adder 300 to produce the filter output 120.

In both versions of the filter, a branch is tapped off and the result of this branch is added by adder 300 to the output of the fifth delay block 260 to produce the output received by adder 290.

In the first version of the filter, the branch consists of an adder 310 and a gain block 320. The adder 310 subtracts the output of second delay block 230 from the output of third delay block 240. The result is then received by gain block 20, the output of which is added by the adder 300 to the output of fifth delay block 260.

In the second version of the filter, the branch consists of an adder 330, a gain block 340, and a delay block 350. The adder 330 subtracts the output of first delay block 220 from the output of second delay block 230. The result is then received by gain block 340 and its output is received by the sixth delay block 350. The output of delay block 350 is then the result of the branch and is received by adder 300.

As can be seen, the two branches have a commonality in that the adders 310, 330 each subtract an output of a delay block from the output of an immediately succeeding delay block. For the first variant (FIG. 4), the output of the second delay block 230 is subtracted from the output of the third delay block 240. For the second variant (FIG. 5), the output of the first delay block 220 is subtracted from the output of the second delay block 230. The output of both adders 310, 330 is then passed to a gain block 320, 340.

With respect to the filter 150, FIG. 6 illustrates a preferred $3^{rd}$ order filter for use with the DSM of FIG. 2. The filter 150 has an input 190 that is received by a first filter block 360. The output of first delay block 360 is received by a second delay block 370, the output of which is received by a third delay block 380. The output of third delay block is received by adder 390. The adder 390 adds this output to the output of gain block 400. The gain block 400 receives its input as the result from adder 410. Adder 410 subtracts the output of second delay block 370 from the output of the first delay block 360. The output of adder 390 is the output 130 of the filter 150.

It should be noted that the implementation of the different components of the DSM is merely the implementation of the different elements of the components. The quantizer 170 merely selects the appropriate bits for feeding back to the filters 140, 150 and for outputting as the modulator output 60.

It should further be noted that while the above preferred embodiments employ a $5^{th}$ order filter and a $3^{rd}$ order filter, other permutations are possible. One filter should be of a higher order than the other and the higher order filter should receive the bitstream of the MSB of the fractional output while the lower order filter should receive the LSB of the fractional output.

To generalize the above concept, a plurality of filters may be used, each filter having a higher order than an immediately preceding filter. Each filter would be fed a portion of the fractional portion of the quantizer's output, the highest order filter receiving the most significant bits and the lowest order filter receiving the lowest order bits.

Figure 7:
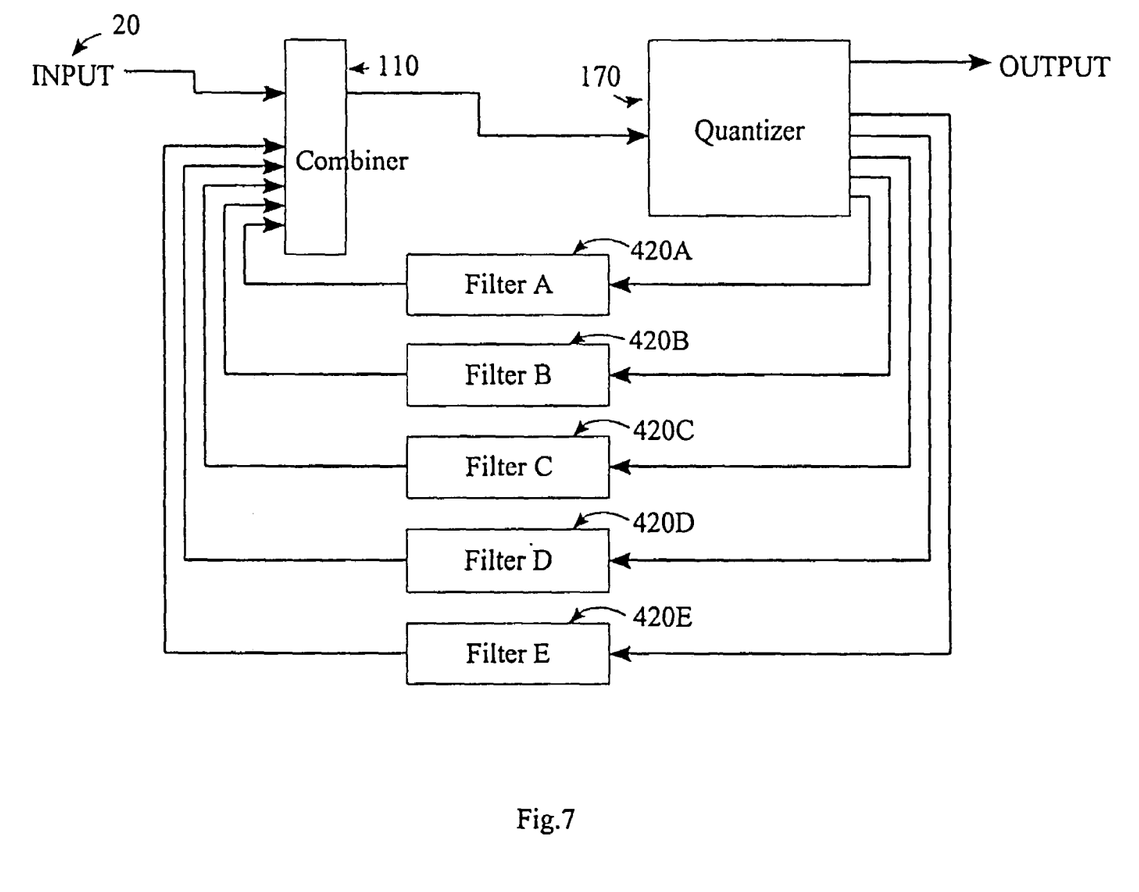
FIG. 7 is a block diagram of a delta sigma modulator using five filters.

Referring to FIG. 7, filter configuration is illustrated. The quantizer 170 receives the output of the combiner 110. The combiner 110 receives the input to the delta sigma modulator and the outputs of filters 420A-420E. The filters 420A-420E each have successively higher orders such that filter 420A has the lowest order while filter 420E has the highest order. Also, this means that filter 420A receives the least significant bits of the fractional part of the quantizer bitstream output while filter 420E receives the most significant bits of the same fractional part of the quantizer output. As an example, if the quantizer has a 20 bit wide bitstream output, each filter receives 4 bits with filter 420A receiving the least significant 4 bits and filter 420E receiving the 4 most significant bits. The filter 420B would receive the 4 bits after the 4 least significant bits while filter 420C would receive the next 4 bits. In terms of the order of the filters, this can be expressed mathematically as:

order filter A<order filter B<order filter C<order filter D<order filter E

Figure 8:
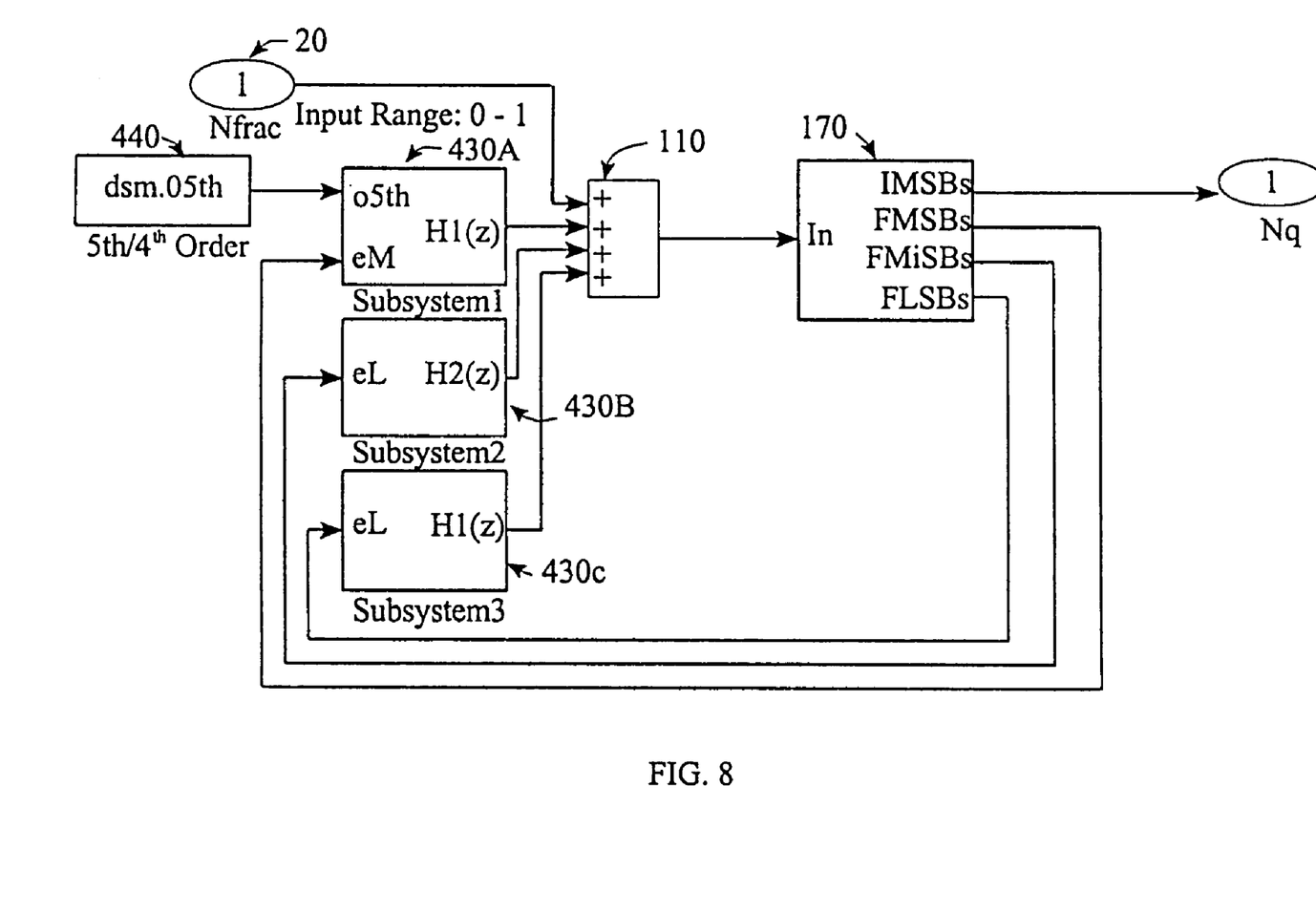
FIG. 8 is a block diagram of a delta sigma modulator using three filters.

Another possible configuration is that illustrated in FIG. 8. In FIG. 8, the delta sigma modulator uses three filters as opposed to the five filters in FIG. 7 and the two filters in FIG. 2. Again, as in FIG. 7, the quantizer 170 receives the output of the combiner 110 which, in turn, receives the outputs of the filters 430A-430C. Along with these outputs, the combiner 110 also receives the input 20 to the delta sigma modulator. The filter 430A has the highest order of the three filters and, as such, receives the most significant bits (FMSBs) of the fractional output. The filter 430C has the lowest order of the filters and thus receives the least significant bits (FLSBs) of the fractional output of the quantizer 170. The filter 430B receives the middle bits (FmiSBs) of the fractional output. As an example, if the fractional output of the quantizer was a 15 bit wide bit bitstream, then filter 430A would receive the 5 most significant bits and filter 430C would receive the 5 least significant bits. Filter 430B would receive the middle 5 bits.

It should be noted that the delta sigma modulator of FIG. 8 has an extra input 440. The input 440 is a select input which selects whether filter 430A performs as a $4^{th}$ order filter or a $5^{th}$ order filter. Depending on this select input, the performance characteristics of the delta sigma modulator can be adjusted.

Figure 9:
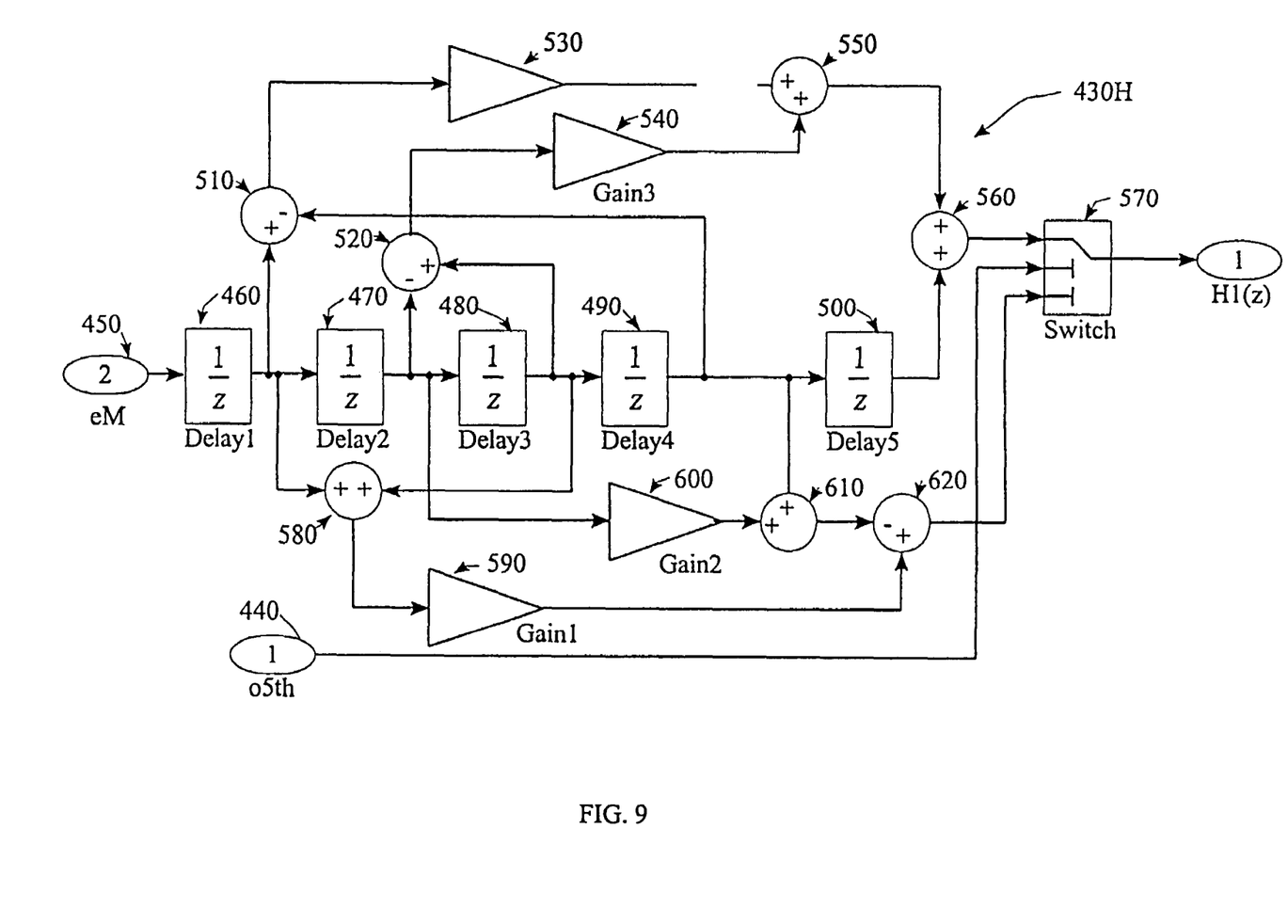
FIG. 9 is a block diagram of a switchable 4th/5th order filter as used in the delta sigma modulator of FIG. 8.

Referring to FIG. 9, the internal components of the configurable filter 430A is illustrated. The filter 430A has a select input 440 and a bitstream input 450. The bitstream input 450 is received by a delay block 460 whose output is received by another delay block 470. The output of delay block 470 is received by delay block 480 and delay block 480's output is received by delay block 490. Delay block 500 then receives the output of delay block 490. Adder 510 subtracts the output of delay block 490 from the output of delay block 460 while adder 520 subtracts the output of delay block 470 from the output of delay block 480. Gain block 530 receives the output of adder 570 and gain block 540 receives the output of adder 520. Adder 550 then adds the outputs of gain blocks 530, 540. Adder 560 then adds the output of adder 550 with the output of gain block 500. The output of adder 560 is then received as one of the inputs to a switch block 570. A second input to the switch block 570 is the select input 440.

The other portion of the delta sigma modulator 430A uses adder 580 which adds the outputs of delay blocks 460, 480. The output of this adder 580 is received by gain block 590. Gain block 600 receives the output of delay block 470 and the output of this gain block 600 is added to the output of delay block 490 by adder 610. The output of adder 610 is then subtracted from the output of gain block 590 by adder 620. The output of adder 620 is the third input to the switch block 570.

Depending on the value of select input 440, the switch block sends either the output of adder 560 or the output of adder 620 as the output of the filter 430A. If the output of adder 560 is selected, then the output of filter 430A is that of a $5^{th}$ order filter. Similarly, if the output of adder 620 is selected, then the output of filter 430A is that of a $4^{th}$ order filter.

Figure 10:
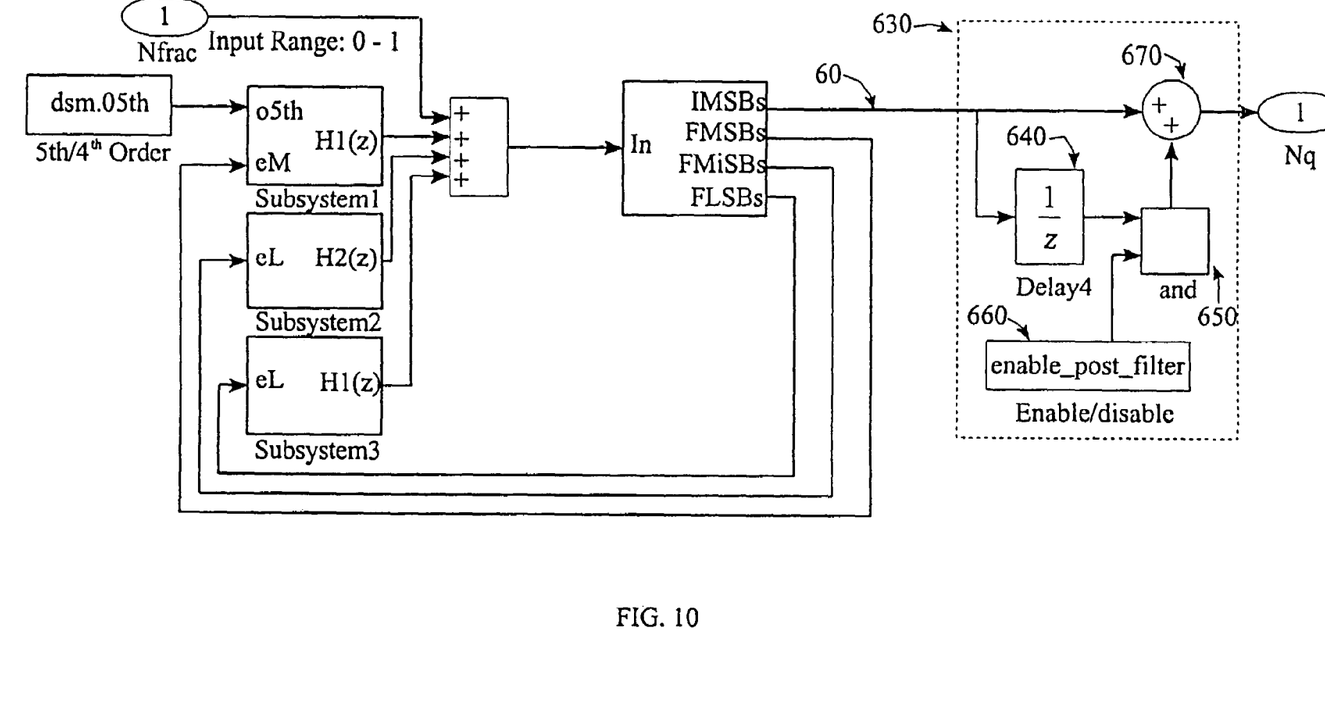
FIG. 10 is a block diagram of the delta sigma modulator of FIG. 8 and including a post filter.

As an added refinement to the delta sigma modulators described above, a post filter may be added to filter the output of the delta sigma modulator. Referring to FIG. 10, the delta sigma modulator of FIG. 8 is illustrated with a post filter 630 receiving the integer output 60 of the modulator. The post filter 630 taps the integer output 60 and this is received by a delay block 640. The output of the delay block 640 is then received by an AND block 650. The AND block also receives an enable input 660 that enable or disables the post filter 630. If the enable input 650 is activated, the output of the delay block 640 is added to the integer output 60 by adder 670. The output of ader 670 is therefore the ultimate output of the delta sigma modulator.

The post filter 630 may be used with any of the delta sigma modulators whose output may require further processing other types of post filters may also be used. In fact, any FIR (finite impulse response) filter may be used as a post filter. In the post filter of FIG. 10, the filter is $1+2^{-1}$ and is programmable (enable/disable capable).

A person understanding this invention may now conceive of alternative structures and embodiments or variations of the above all of which are intended to fall within the scope of the invention as defined in the claims that follow.

What is claimed is:

1. A delta sigma modulator comprising:
   a combiner receiving an input;
   a quantizer receiving an output of said combiner and producing an integer output and a first and a second fractional output;
   a first filter receiving said first fractional output;
   a second filter receiving said second fractional output;
   wherein
   said integer, output comprises most significant bits of an integer result of said quantizer;
   said first fractional output comprises most significant bits of a fractional result of said quantizer;
   said second fractional output comprises least significant bits of said fractional result of said quantizer;
   said combiner receives outputs of both first and second filters;

said first filter is an n order filter, said second filter is an m order filter and n>m.

2. A delta sigma modulator according to claim 1 wherein said combiner comprises cascaded adders said cascaded adders comprising:
   a first adder receiving and adding said input and an output of said second filter; and
   a second adder receiving and adding an output of said first adder and an output of said first filter.

3. A delta sigma modulator according to claim 1 wherein n=5.

4. A delta sigma modulator according to claim 3 wherein m=3.

5. A delta sigma modulator according to claim 3 wherein said first filter comprises:
   a fist delay block receiving an Input to said first filter;
   a second delay block receiving an output of said first delay block;
   a third delay block receiving an output of said second delay block;
   a fourth delay block receiving an output of said third delay block;
   a fifth delay block receiving an output of said fourth delay block;
   a first adder subtracting said output of said second delay block from an output of said third delay block;
   a second adder subtracting said output of said fourth delay block from said output of said first delay block;
   a first gain block receiving an output of said first adder;
   a second gain block receiving a output of said second adder;
   a third adder adding outputs of said fifth delay block and said first gain block;
   a fourth adder adding an output of said third adder and an output of said second gain block,
wherein
   an output of said fourth adders is said output of said first filter.

6. A delta sigma modulator according to claim 1 wherein m=3.

7. A delta sigma modulator according to claim 3 wherein said first filter comprises:
   a first delay block receiving an input of said first filter;
   a second delay block receiving an output of said first delay block;
   a third delay block receiving an output of said second delay block;
   a fourth delay block receiving an output of said third delay block;
   a fifth delay block receiving an output of said fourth delay block;
   a first adder subtracting said output of said first delay block from said output of said second delay block;
   a second adder subtracting said output of said fourth delay block from said output of said first delay block;
   a first gain block receiving an output of said first adder;
   a second gain block receiving an output of said second adder;
   a sixth delay block receiving an output of said first gain block
   a third adder adding an output of said sixth delay block and an output of said fifth delay block;
   a fourth adder adding an output of said third adder and an output of said second gain block,
wherein
   an output of said fourth adder is said output of said fist filter.

8. A delta sigma modulator according to claim 3 wherein said first filter comprises:
   a first delay block receiving an input of said first filter;
   a second delay block receiving an output of said first delay block;
   a third delay block receiving an output of said second delay block;
   a fourth delay block receiving an output of said third delay block;
   a fifth delay block receiving an output of said fourth delay block;
   a branch comprising:
      a first adder subtracting an output of a delay block from an output of an immediately adjacent delay block; and
      a first gain block receiving an output of said first adder
   a second adder subtracting said output of said fourth delay block from said output of said first delay block;
   a second gain block receiving an output of said second adder;
   a third adder adding an output of said filter delay block and a result from said branch;
   fourth adder adding an output of said filter third adder and said second gain block,
wherein
   an output of said fourth adder is said output of said first filter.

9. A delta sigma modulator according to claim 8 wherein said first adder subtracts said output of said second delay block from said output of said third delay block, and
   said result of said branch is an output of said first gain block.

10. A delta sigma modulator according to claim 8 wherein said first adder subtracts said output of said first delay block from said result of said second delay block wherein said branch flitter comprises a sixth delay block receiving an output of said first gain block, a result of said block being an output of said sixth delay block.

11. A delta sigma modulator according to claim 5 wherein said second filter comprises:
   a first delay block receiving an input of said second filter;
   a second delay block receiving an output of said first delay block;
   a third delay block receiving an output of said second delay block;
   a first adder subtracting said output of said second delay block from said output of said first delay block;
   a gain block receiving an output of said first adder;
   a second adder adding said output of said third delay block with an output of said gain block;
wherein
   an output of said second adder is said output of said second filter.

12. A delta sigma modulator comprising:
   a combiner receiving an input;
   a quantizer receiving an output of said combiner and producing an integer output and at least two fractional outputs;
   at least two filters, each of said at least two filters receiving one of said at least two fractional outputs,
wherein
   said combiner receives outputs of said at least two filters;
   each of said at least two filters has an order higher than an immediately preceding filter.

13. A delta sigma modulator according to claim 12 wherein at least one filter of said at least two filters has a user configurable order.

14. A delta sigma modulator according to claim 12 wherein at least one filter of said at least two filters comprises:
a first delay block receiving an input of said filter;
a second delay block receiving an output of said first delay block;
a third delay block receiving an output of said second delay block;
a fourth delay block receiving an output of said third delay block;
a fifth delay block receiving an output of said fourth delay block;
a first adder subtracting said output of said second delay block from an output of said third delay block;
a second adder subtracting said output of said fourth delay block from said output of said first delay block;
a first gain block receiving an output of said first adder;
a second gain block receiving an output of said second adder;
a third adder adding outputs of said fifth delay black and said first gain block;
a fourth adder adding an output of said third adder and an output of said second gain block,
wherein
an output of said fourth adder is said output of said filter.

15. A delta sigma modulator according to claim 12 wherein at least one filter of said at least two filters comprises:
a first delay block receiving an input of said filter;
a second delay block receiving an output of said first delay block;
a third delay block receiving an output of said second delay block;
a fourth delay block receiving an output of said third delay block;
a fifth delay block receiving an output of said fourth delay block;
a first adder subtracting said output of said first delay block from said output of said second delay block;
a second adder subtracting said output of said fourth delay block from said output of said first delay block;
a first gain block receiving an output of said first adder;
a second gain block receiving an output of said second adder;
a sixth delay block receiving an output of said first gain block;
a third adder adding an output of said sixth delay block and an output of said fifth delay block;
a fourth adder adding an output of said third adder and an output of said second gain block,
wherein
an output of said fourth adder is said output of said filter.

16. A delta sigma modulator according to claim 12 wherein at least one filter of said at least two filters comprises:
a first delay block receiving an input of said filter;
a second delay block receiving an output of said first delay block;
a third delay block receiving an output of said second delay block;
a fourth delay block receiving an output of said third delay block;
a fifth delay block receiving an output of said fourth delay block;
a branch comprising:
a first adder subtracting an output of a delay block from an output of an immediately adjacent delay block; and
a first gain block receiving an output of said first adder
a second adder subtracting said output of said fourth delay block from said output of said first delay block;
a second gain block receiving an output of said second adder;
a third adder adding an output of said filter delay block and a result from said branch;
a fourth adder adding an output of said filter third adder and said second gain block,
wherein
an output of said fourth adder is said output of said filter.

17. A delta sigma modulator according to claim 12 wherein at least one filter of said at least two filters comprises:
a first delay block receiving an input of said filter;
a second delay block receiving an output of said first delay block;
a third delay block receiving an output of said second delay block;
a first adder subtracting said output of said second delay block from said output of said first delay block;
a gain block receiving an output of said first adder;
a second adder adding said output of said third delay block with an output of said gain block,
wherein
an output of said second adder is said output of said filter.

18. A configurable filter comprising:
a first delay block receiving a bitstream input;
a second delay block receiving an output of said first delay block;
a third delay block receiving an output of said second delay block;
a fourth delay block receiving an output of said third delay block;
a fifth delay block receiving an output of said fourth delay block;
a first adder subtracting said output of said fourth delay block from said output of said first delay block;
a second adder subtracting said output of said second delay block from said output of said third delay block;
a first gain block receiving an output of said first adder;
a second gain block receiving an output of said second adder;
a third adder outputs of said first and second gain block;
a fourth adder adding an output of said third adder and said output of said fifth gain block;
a fifth adder adding said output of said first delay block and said output of said third delay block;
a third gain block receiving an output of said fifth adder;
a fourth gain block receiving said output of said second gain block;
a sixth adder adding said output of said fourth delay block and an output of said fourth gain block;
a seventh adder subtracting an output of said sixth adder from an output of said third gain block;
a switch block receiving a select input, an output of said fourth adder, and an output of said seventh adder,
wherein
said select input determines if said filter acts as a fourth order filter or a fifth order filter.

19. A filter according to claim 18 wherein said filter is used in a delta sigma modulator.

20. A delta sigma modulator according to claim 12 wherein at least one filter of said at least two filters comprises:
- a first delay block receiving a bitstream input;
- a second delay block receiving an output of said first delay block;
- a third delay block receiving an output of said second delay block;
- a fourth delay block receiving an output of said third delay block;
- a fifth delay block receiving an output of said fourth delay block;
- a first adder subtracting said output of said fourth delay block from said output of said first delay block;
- a second adder subtracting said output of said second delay block from said output of said third delay block;
- a first gain block receiving an output of said first adder;
- a second gain block receiving an output of said second adder;
- a third adder outputs of said first and second gain, block;
- a fourth adder adding an output of said third adder and said output of said fifth gain block;
- a fifth adder adding said output of said first delay block and said output of said third delay block;
- a third gain block receiving an output of said fifth adder;
- a fourth gain block receiving said output of said second gain block;
- a sixth adder adding said output of said fourth delay block and an output of said fourth gain block;
- a seventh adder subtracting an output of said sixth adder from an output of said third gain block;
- a switch block receiving a select input, an output of said fourth adder, and an output of said seventh adder, wherein
said select input determines if said filter acts as a further order filter or a fifth order filter.

21. A delta sigma modulator according to claim 1 wherein said integer output is received by an adder and a delay block, an output of said delay block being added to said integer output by said adder.

22. A delta sigma modulator according to claim 12 wherein said integer output is received by an adder and a delay block, an output of said delay block being added to said integer output by said adder.

23. A delta sigma modulator according to claim 1 wherein said integer output is received by a FIR (finite impulse response) filter.

24. A delta sigma modulator according to claim 12 wherein said integer output is received by a FIR (finite impulse response) filter.

25. A delta sigma modulator according to claim 23 wherein said FIR filter is programmable.

26. A delta sigma modulator according to claim 24 wherein said FIR filter is programmable.

* * * * *